United States Patent [19]
Kimura et al.

[11] Patent Number: 5,786,304
[45] Date of Patent: Jul. 28, 1998

[54] JOINING PRODUCT OF OXIDE SUPERCONDUCTING MATERIAL AND PROCESS FOR PRODUCING THE SAME

[75] Inventors: Keiichi Kimura; Katuyoshi Miyamoto; Misao Hashimoto, all of Kawasaki, Japan

[73] Assignee: Nippon Steel Corporation, Tokyo, Japan

[21] Appl. No.: 313,053

[22] PCT Filed: Apr. 2, 1993

[86] PCT No.: PCT/JP93/00432

§ 371 Date: Sep. 30, 1994

§ 102(e) Date: Sep. 30, 1994

[87] PCT Pub. No.: WO93/20025

PCT Pub. Date: Oct. 14, 1993

[30] Foreign Application Priority Data

Apr. 3, 1992 [JP] Japan ................... 4-109088

[51] Int. Cl.⁶ .................. H01L 39/12; H01L 39/24
[52] U.S. Cl. .................. 505/234; 505/450; 505/451; 505/490; 505/491; 505/500; 505/701; 505/704; 505/927; 428/701; 428/702; 428/930
[58] Field of Search .................. 505/822, 450, 505/927, 701, 702, 703, 704, 234, 235, 236, 237, 238, 239, 740, 451, 452, 490, 491, 500; 428/688, 689, 701, 702, 930

[56] References Cited

U.S. PATENT DOCUMENTS

| | | | |
|---|---|---|---|
| 5,081,074 | 1/1992 | Murayama | 505/701 |
| 5,114,905 | 5/1992 | Giessen | 505/727 |
| 5,051,397 | 9/1991 | Sato | 428/688 |
| 5,053,385 | 10/1991 | Capone | 505/740 |
| 5,079,226 | 1/1992 | Sakai | 505/82 Z |

(List continued on next page.)

FOREIGN PATENT DOCUMENTS

A-0324534   7/1989   European Pat. Off. .

(List continued on next page.)

OTHER PUBLICATIONS

"Joining of High Current Bulk Y–Ba–Cu–O Superconductors", by K. Salama et al., Appl Phys Lett 60 (7); 17 Feb. 1992, pp. 898–900.

(List continued on next page.)

*Primary Examiner*—Marie Yamnitzky
*Attorney, Agent, or Firm*—Kenyon & Kenyon

[57] ABSTRACT

A joining product of oxide superconducting materials having a high current density and process for producing the same. A joining product comprising a plurality of oxide superconducting materials having an identical crystal orientation joined with each other through a superconducting phase of the same type as described above which has the same crystal orientation as the oxide superconducting materials and a lower peritectic temperature than the oxide superconducting materials. A joining method comprising the steps of: regulating oxide superconducting materials to be joined so that they have an identical crystal orientation; either inserting as a solder a material comprising elements constituting an oxide superconductor having a lower peritectic temperature than the oxide superconducting materials or bringing the material comprising elements constituting an oxide superconductor having a lower peritectic temperature than the oxide superconducting materials into contact with the oxide superconducting materials to be joined; heating the assembly to a temperature below the peritectic temperature of the superconducting materials to be joined and above the peritectic temperature of the solder; and gradually cooling the heated assembly to orient and grow the same type of oxide superconductor at the joining interface. A junction product of oxide superconducting materials free from such crystal grain boundary as to inhibit the current flow and having a high critical current density can be provided and can be utilized as a magnet, a magnetic shield and a current leading material.

5 Claims, 15 Drawing Sheets

U.S. PATENT DOCUMENTS

| | | | |
|---|---|---|---|
| 5,116,810 | 5/1992 | Joshi | 428/930 |
| 5,134,040 | 7/1992 | Benz | 505/927 |
| 5,439,879 | 8/1995 | Salama | 505/450 |
| 5,521,150 | 5/1996 | Murakami et al. | 505/450 |

FOREIGN PATENT DOCUMENTS

| | | |
|---|---|---|
| A-0447767 | 9/1991 | European Pat. Off. . |
| A1-556052 | 8/1993 | European Pat. Off. . |
| A 64-103965 | 4/1989 | Japan . |
| A 1-157468 | 6/1989 | Japan . |
| A 1-157469 | 6/1989 | Japan . |
| A 3-237073 | 10/1991 | Japan . |
| A 3-290377 | 12/1991 | Japan . |
| A 4-2669 | 1/1992 | Japan . |
| A 4-2670 | 1/1992 | Japan . |
| A 4-104970 | 4/1992 | Japan . |

OTHER PUBLICATIONS

"Quench and Melt Growth (QMG) Process for Large Bulk Superconductor Fabrication", by M. Morita et al., proceedings of the 3rd International Symposium on Superconductivity (ISS'90), Nov. 6–9, 1990, Sendai, pp. 733–736.

Patent Abstracts of Japan, vol. 18, No. 61 (C–1160) Feb. 2, 1994, & JP–A–05 279 028 (NGK Insulators Ltd.), Oct. 26, 1993.

Patent Abstracts of Japan, vol. 151, No. 59 (E–1059), Apr. 22, 1991 & JP–A–03 030 264 (Agency IF Ind., Science and Technology) Feb. 8, 1991.

Patent Abstracts of Japan, vol. 14, No. 263 (E–938), Jun. 7, 1990 & JP–A–02 082 482 (Kawasaki Steel Corp), Mar. 23, 1990.

Patent Abstracts of Japan, vol. 15, No. 26 (E–1025) Jan. 22, 1991 & JP–A–02 270 279 (Sumitomo Metal Ind., Ltd.), Nov. 5, 1990.

JOINING PRODUCT OF OXIDE SUPERCONDUCTING MATERIAL AND PROCESS FOR PRODUCING THE SAME

TECHNICAL FIELD

The present invention relates to a $REBa_2Cu_3O_x$-based superconducting joined product having a high critical current density and a process for producing the same.

BACKGROUND ART $REBa_2Cu_3O_x$-based superconductors have a high critical temperature exceeding the liquid nitrogen temperature and hence can offer a great economical benefit when they could be put to practical use. In these superconductors, however, a crystal grain boundary serves as a weak link, so that a high superconducting current cannot be flowed across the crystal grain boundary and, in particular, the critical current density is remarkably lowered in a magnetic field. For this reason, the practical use of the $REBa_2Cu_3O_x$-based superconductors could have not been realized in the field of heavy current.

The production of a $REBa_2Cu_3O_x$-based superconducting bulk material comprising large crystal grains having a volume of not less than 50 $cm^3$ has become possible (see M. Morita. et al: Advances in superconductivity III, Springer-Verlag, Tokyo, 1990, pp. 733–736) by the melt process, which is a process for producing an oxide superconducting material, including the QMG process (quench and melt growth process) (see U.S. patent application Ser. No. 07/735,105, now U.S. Pat. No. 5,278,137, or Japanese Unexamined Patent Publication (Kokai) No. 2-153,803). The melt process basically comprises heating a starting material for a $REBa_2Cu_3O_x$-based superconductor to a semi-melted state wherein a $RE_2BaCuO_5$ phase is present together with a liquid phase composed mainly of Ba, Cu and O; and gradually cooling the system from just above the peritectic temperature to conduct crystal growth of the $REBa_2Cu_3O_x$ phase. Large grains prepared by this process contains a small angle grain boundary having a crystal misorientation of several degrees but no grain boundary having a large angle which serves as a weak link. For this reason, in this material, the critical current density within the grains is as high as 10000 $A/cm^2$ or more at 77 K and 1 T, so that the material is considered to be applicable as materials for superconducting coils, bulk magnets, magnetic shields and current leads.

In order that the $REBa_2Cu_3O_x$-based superconducting bulk material prepared by the melt process can be used as these materials, it is necessary to increase the size, area or length. Since, however, the melt process is basically a technique for producing an oxide superconductor having no grain boundary by gradual cooling from the melted state, there is a limitation on an increase in size. Further, the material produced by the melt process cannot be subjected to working which breaks crystal grains, such as rolling and bending. Therefore, it is considered that if it becomes possible to prepare a junction having a high critical current density, an increase in size of the material and the shaping become easy, which enables the material to be used in the above applications.

Joining methods for an oxide superconductor, which have been reported in the art, include a method which utilizes solid phase diffusion and a method wherein a liquid phase is formed to conduct joining. Most of these joining methods are intended for use in joining between sintered bodies, and no consideration is taken for the prevention of the formation of a grain boundary in the junction. Therefore, the formation of a grain boundary in the junction is unavoidable. In this case, the crystal grain boundary serves as a weak link, and no high critical current density can be obtained. Further, also when the material is used as a magnetic shielding material, no good shielding property can be obtained because the grain boundary permits a magnetic field to penetrate. No joining process has hitherto been reported which is intended for use in a material free from a grain boundary in the junction and having a high critical current density. Specific examples of the convention process will now be described.

Examples of methods for conducting joining between oriented $REBa_2Cu_3O_x$-based superconductors include a method which comprises inserting a single crystal powder of the same superconductor as those to be joined between junction bulks and conducting sintering under pressure in a magnetic field (see Japanese Unexamined Patent Publication (Kokai) No. 2-270279) and a method which comprises polishing the joining interface and then conducting sintering in a solid phase while applying pressure (see K. Salama et al., Appl. Phys. Lett. 60 (1992), p.898). However, according to reproduction tests on these joining processes conducted by the present inventors, the above joining processes in a solid phase provide no junction having a satisfactory high strength and a high critical current density.

A process which comprises once forming a liquid phase in the joining interface and then conducting joining is considered advantageous from the viewpoint of strength. Methods which comprise forming a liquid phase and bringing also the joining interface to a superconducting state include a method which comprises locally heating the junction by means of a laser beam to a temperature above the peritectic temperature and then conducting solidification for joining (see Japanese Unexamined Patent Publication (Kokai) No. 2-82482) and a method wherein use is made of a brazing material which has a low melting point (peritectic temperature) and can be brought to a superconducting state upon solidification (see Japanese Unexamined Patent Publication (Kokai) Nos. 63-291377, 1-242473 and 3-237073 and U.S. Pat. Nos. 5116810 and 5079226). In these methods, however, melting and solidification are merely carried out, and no means for preventing the formation of a grain boundary in the joining interface is used. In these prior art, working examples are also directed to joining of sintered bodies.

In sintered body, the crystal orientation arbitrarily varies from grain to grain, so that it cannot be said that the crystal orientation is uniform. Therefore, in joined products produced by the above methods, the crystal grain boundary serves as a weak link, so that no high critical current density can be obtained. In particular, in a magnetic field, since a lowering in critical current density is so significant that the joined-product having a weak link is unsuitable as a material for constituting a magnet generating a strong magnetic field, a shielding material for shielding a magnetic field having a medium strength or a current leading material for flowing a large current.

An object of the present invention is to provide a joined product comprising $REBa_2Cu_3O_x$-based superconducting materials and having a junction free from any large angle grain boundary and a method for joining the $REBa_2Cu_3O_x$-based superconducting materials.

DISCLOSURE OF INVENTION

In order to solve the above-described problem, the present invention provides a joining process which comprises aligning highly oriented $REBa_2Cu_3O_x$-based superconducting materials to be joined so as to have an identical crystal orientation; either inserting as a solder a $REBa_2Cu_3O_x$-based superconducting material of a composition having a lower peritectic temperature than the materials to be joined or a raw material therefor between the materials to be joined or bringing the solder (junction material) into contact with the materials to be joined and applying the solder to the materials to be joined so that it sits astride on the materials to be joined; heating the assembly to such an extent that the $REBa_2Cu_3O_x$-based superconducting materials to be joined remain stable with the solder being in a semi-melted state comprising a $RE_2BaCuO_5$ phase and, present together therewith, a liquid phase composed mainly of Ba, Cu and O; and gradually cooling the heated assembly to cause a peritectic reaction in the solder portion, thereby forming and growing $REBa_2Cu_3O$, while maintaining the crystal orientation of the $REBa_2Cu_3O_x$-based superconducting materials to be joined, whereby a junction having a high critical current density is prepared without occurrence of any large angle grain boundary.

In the joining process according to the present invention, the following requirements should be met.

① $REBa_2Cu_3O_x$-based superconducting materials to be joined should have an orientation.

② Oriented $REBa_2Cu_3O_x$-based superconducting materials to be joined should be aligned so that they have an identical crystal orientation, and a solder should be placed and adhered to the materials on their surfaces to be joined.

③ The solder should be a material which has a lower peritectic temperature than the $REBa_2Cu_3O_x$-based superconducting materials to be joined and, upon melting and solidification, can be brought to a superconductor having the same crystal structure as the $REBa_2Cu_3O_x$-based superconducting materials to be joined.

BEST MODE FOR CARRYING OUT THE INVENTION

Materials prepared by the above-described QMG process or other processes, oriented films, etc., are considered usable as $REBa_2Cu_3O_x$-based superconductors to be joined. As described above, the materials having an identical crystal orientation used herein refers to large crystals which may have a small angle grain boundary having a crystal misorientation of several degrees but are free from a grain boundary having a large angle grain boundary serving as a weak link. The $REBa_2Cu_3O_x$-based superconductors to be joined need not have an identical composition so far as they have superconducting properties.

Figure 1:
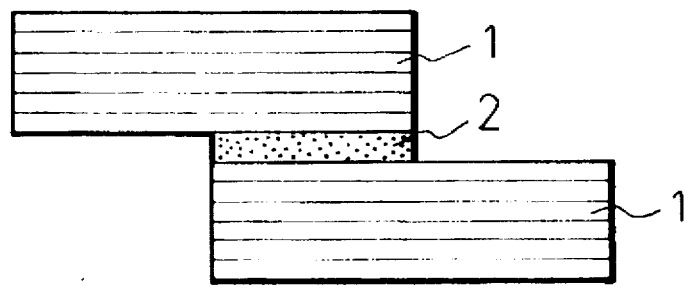
FIG. 1 is a schematic diagram showing the first embodiment of joining.
Figure 2:
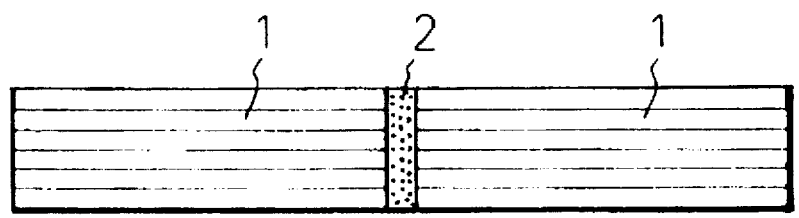
FIG. 2 is a schematic diagram showing the second embodiment of joining.
Figure 3:
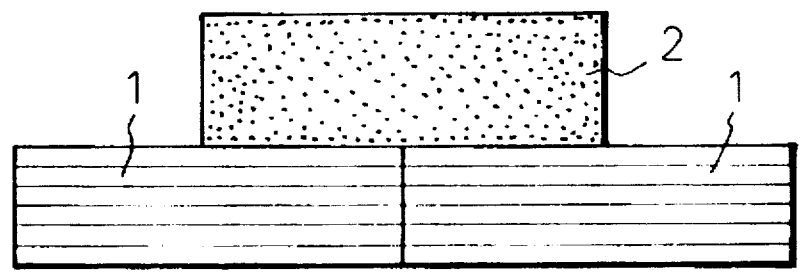
FIG. 3 is a schematic diagram showing the third embodiment of joining.

The highly oriented $REBa_2Cu_3O_x$-based superconductors may be joined, for example, according to an embodiment as shown in FIGS. 1 and 2 wherein a solder is inserted as a joining layer between superconductors 1 to be joined and joining is then carried out and an embodiment as shown in FIG. 3 wherein a joining bulk (a solder or a junction material) 2 is joined to each of the superconductors 1 without inserting any solder between the superconductors 1 to be joined. In the embodiment as shown in FIG. 3, the joining phase 2 per se may occupy a high proportion of the final superconducting joined product. The face to be joined may not be always flat and may be modified, for example, rendered uneven.

In particular, in the embodiment shown in FIG. 3, a bulk may be used as the solder 2. In this case, as is apparent from the phase diagram shown in FIG. 4, which will be described joining bulk, when the bulk is heat-treated, it is decomposed into a $RE_2BaCuO_5$ phase and a liquid phase composed mainly of Ba, Cu and O. Since the $RE_2BaCuO_5$ phase is solid, it is transformed to $REBa_2Cu_3O_x$ while maintaining the shape of the bulk. In the present invention, the term "solder" is used in meaning including such a joining bulk.

Further, the $REBa_2Cu_3O_x$-based superconductor to be joined may be in the form of a superconductor film formed on a substrate as well as in the form of a bulk superconductor.

The following method is considered for the preparation of a solder which has a lower peritectic temperature than the $REBa_2Cu_3O_x$-based materials to be joined and, upon cooling, becomes a $REBa_2Cu_3O_x$-based superconducting material of the same type as the $REBa_2Cu_3O_x$-based materials to be joined.

Figure 4:
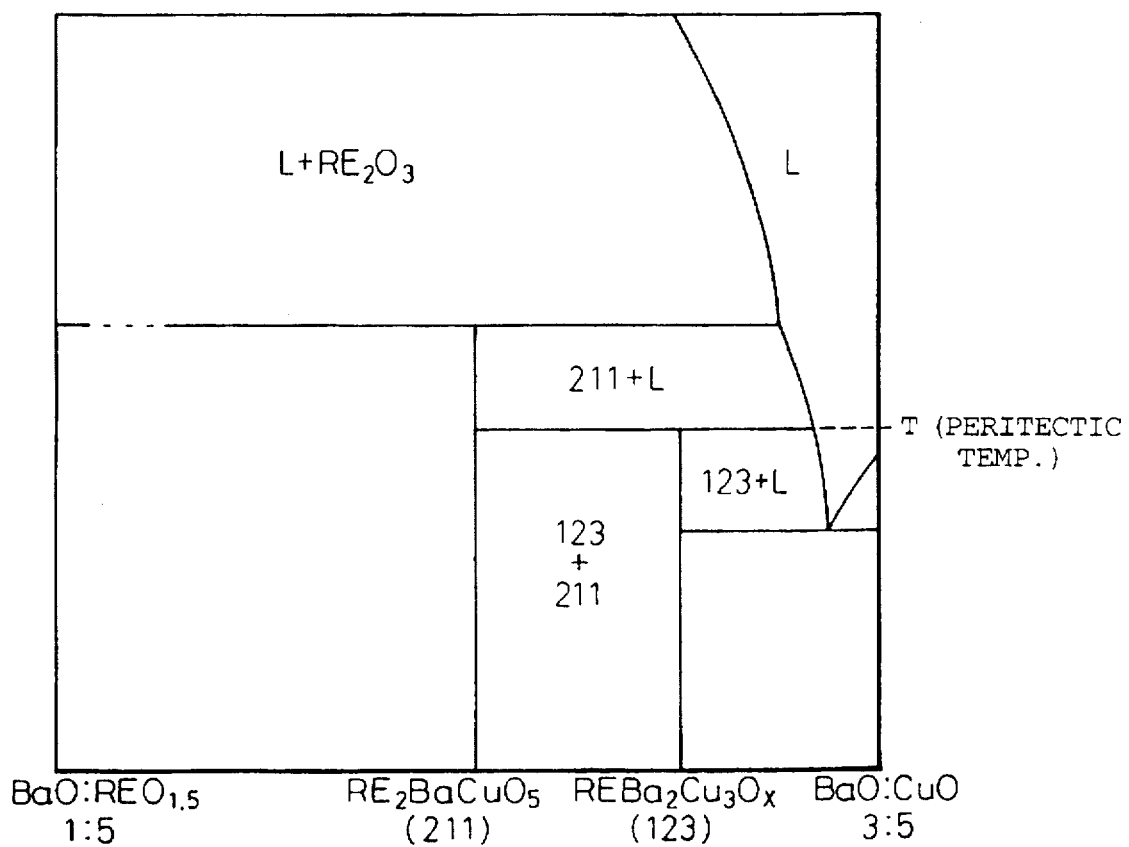
FIG. 4 is a pseudo-binary diagram of $REBa_2Cu_3O_x$.

At the outset, substitution of RE is carried out. FIG. 4 shows a schematic pseudo-binary phase diagram of a $REBa_2Cu_3O_x$-based material. In this case, RE is at least one element selected from the group consisting of Y, Sm, Eu, Gd, Dy, Ho, Er, Tm, Yb and Lu. The material having a composition close to $REBa_2Cu_3O_x$ is decomposed at a high temperature into a $RE_2BaCuO_5$ phase (211) and a liquid phase (L) composed mainly of Ba, Cu and O. When this liquid phase is cooled, it forms $REBa_2Cu_3O_x$ through a peritectic reaction. The peritectic temperature (T) varies depending upon the kind of RE.

The peritectic temperatures (T) of representative $REBa_2Cu_3O_x$ wherein RE comprises one element are summarized bellow.

| RE element | Peritectic temp. (°C.) | RE element | Peritectic temp. (°C.) |
| --- | --- | --- | --- |
| Y | 1000 | Ho | 990 |
| Sm | 1060 | Er | 970 |
| Eu | 1050 | Tm | 940 |
| Gd | 1030 | Yb | 900 |
| Dy | 1010 | | |

These are values determined in the air, and the peritectic temperature varies depending upon the partial pressure of oxygen. For example, the peritectic temperature increases by about 30° C. in pure oxygen of 1 atm. In general, the smaller the ion radius, the lower the peritectic temperature. When RE comprises two elements, the peritectic temperature is intermediate between the peritectic temperatures of these two elements. Nd does not form $RE_2BaCuO_5$ even at a high temperature, and substitution of a part of RE in $REBa_2Cu_3O_x$ with Nd can increase the peritectic temperature.

This phenomenon may be utilized as follows. A system having a lower peritectic temperature than the $REBa_2Cu_3O_x$ materials to be joined, wherein RE is substituted, is selected as a solder to form a liquid phase in the junction at a temperature below the peritectic temperature of $REBa_2Cu_3O_x$ to be joined, which liquid phase is then cooled to form $REBa_2Cu_3O_x$ in the junction, thereby forming a junction through which a superconducting current can be flowed. Before the heat treatment, the solder need not be in the form of a $REBa_2Cu_3O_x$-based material and may be in the form of a raw material for $REBa_2Cu_3O_x$, such as oxides or double oxides of elements constituting the composition. Further, the composition may not be always stoichiometric and may have a ratio of RE:Ba:Cu deviated from 1:2:3 and contain minor amounts of impurities so far as the superconducting properties are not spoiled. The ratio of RE to Ba to Cu (RE:Ba:Cu) is preferably in a region formed by connecting points (10:60:30), (10:20:70) and (50:20:30) in terms of atomic %.

The second method is to add Ag or Au element, which serves to lower the peritectic temperature of $REBa_2Cu_3O_x$, to the solder. In this method, RE in the materials to be joined may be the same as RE in the solder. Since, however, the peritectic temperature difference is not larger than that in the first method, this method is preferably used in combination with the substitution of RE element. The Ag or Au element may be introduced, for example, in the form of an oxide such as $Ag_2O$.

Examples of the method for the disposition of the solder include a method wherein the joining area is merely covered with a solder powder, a method wherein a molded, sintered or melting-solidified product of a solder powder is inserted and disposed, a method wherein a mixture of a solder powder with an organic binder is coated and a method wherein a film is formed on the joining area by the sol-gel process or using a film-forming device, such as a sputtering device.

When the $REBa_2Cu_3O_x$-based superconducting materials to be joined do not have an identical crystal orientation, there occurs a difference in crystal lattice, that is, a grain boundary, between joining phases. This grain boundary serves as a weak link to unfavorably lower the critical current density. For this reason, the $REBa_2Cu_3O_x$-based superconducting materials to be joined should be aligned and free from a weak link and further have an identical orientation. It is considered that the difference in crystal orientation can be relaxed to some extent by the joining phase. However, it is particularly desired that the crystal misorientation in the direction of the c-axis and the a-/b-axis be not more than 150. The "c-axis" used herein is defined as the longest axis in a unit lattice of $REBa_2Cu_3O_x$ having an orthorhombic structure, and the "a- and b-axes" are defined as two axes other than the c axis. When the misorientation in these axes exceeds 15°, a joined product having a high critical current density, which is a feature of the present invention, cannot be provided, as will be apparent from examples which will be described later.

Although the $REBa_2Cu_3O_x$ superconductor is orthorhombic, it microscopically has a twin structure wherein the a- and b-axes are present together in such a state that they are mutually deviated by 900, the a- and b-axes being macroscopically indistinguishable from each other. The boundary of the twin where the crystal axes are deviated by 900 does not serve as a weak link. However, when the crystal axes are deviated by an intermediate angle from these axes (therefore 45° C. at the maximum), even though the $REBa_2Cu_3O_x$ superconductors have an identical crystal orientation in the direction of the c-axis, this portion unfavorably serves as a weak bond. That the crystal misorientation in the direction of the a-/b-axis is desirably not more than 15° means that although the $REBa_2Cu_3O_x$ may take a twin structure wherein the a- and b-axes are present together in such a state that they are mutually deviated by 90°, the deviation from these axes is desirably not more than 15°. The a-axis and b-axis, which are macroscopically indistinguishable from each other, will be referred to as "a-/b-axis."

The composition of the $REBa_2Cu_3O_x$-based superconducting materials to be joined may not be always stoichiometric and may have a ratio of RE:Ba:Cu deviated from 1:2:3 and contain minor amounts of impurities so far as the superconducting properties are not spoiled. The ratio of RE to Ba to Cu (RE:Ba:Cu) is preferably in a region formed by connecting points (10:60:30), (10:20:70) and (50:20:30) in terms of atomic %.

In the joined product which has been heated at a temperature below the peritectic temperature of the $REBa_2Cu_3O_x$-based superconducting materials to be joined and above the peritectic temperature of the joining solder, the joining solder portion is decomposed into a $RE_2BaCuO_5$ phase and a liquid phase composed mainly of Ba, Cu and O, and the RE elements are slightly diffused in each other at the interface of the $REBa_2Cu_3O_x$-based superconductors which are being joined to the liquid phase. In order to increase the junction strength, the heating temperature is preferably as high as possible so far as a fracture of the crystal structure of the REBa$_2$Cu$_3$O$_x$-based materials to be joined, which results in a deterioration in properties, does not occur. Further, in order to avoid the deterioration in properties, the junction may be locally heated by using laser as an auxiliary means.

In order to increase the adhesion between the REBa$_2$Cu$_3$O$_x$-based superconducting materials to be joined and the solder, it is desirable to apply pressure from the direction perpendicular to the junction area.

When cooling is then carried out, REBa$_2$Cu$_3$O$_x$ is formed around the peritectic temperature of the solder. In this case, when cooling is carried out gradually around this temperature, in the solder portion, the REBa$_2$Cu$_3$O$_x$ crystal nucleates and grows inheriting the orientation of the interface of the REBa$_2$Cu$_3$O$_x$ to be joined. The crystal of REBa$_2$Cu$_3$O$_x$, which have been newly produced from both sides of the joining area, grow and are finally joined at the intermediate portion. In this case, since the newly formed REBa$_2$Cu$_3$O$_x$ crystals have an identical crystal orientation, no crystal grain boundary occurs in the joining area, so that no weak link is formed. When gradual cooling is not carried out around this temperature, the supercooling becomes so high that the nucleation of REBa$_2$Cu$_3$O$_x$ occurs at the intermediate portion, or the growth rate does not follow thereup. As a result, polycrystallization occurs in the junction, or crystals are not completely connected to one another. The reason why the gradual cooling is carried out around the peritectic temperature of the solder is that it is considered that mutual diffusion occurs at the interface of the REBa$_2$Cu$_3$O$_x$ materials to be joined with the solder, so that the peritectic temperature at the interface is higher than that of the solder per se.

Therefore, the average cooling rate is preferably not more than 100/d (°C./hr), still preferably not more than 40/d (°C./hr), at least in a temperature range of (the peritectic temperature of the solder) ±5° C. based on experience although it depends also upon the thickness of the solder and the temperature gradient of the furnace. In this case, d is the thickness (mm) of the joining layer. The reason why the cooling rate is expressed in average value is that cooling may not be always carried out at a constant rate, and the same effect can be attained also when the materials are held at a constant temperature just below the peritectic temperature. Gradual cooling is preferred also from the viewpoint of avoiding the formation of cracks due to thermal stress.

Thus, according to the present invention, a junction free from a crystal boundary in the junction and having a high critical current density through the junction can be prepared by providing a solder, which has a lower peritectic temperature than REBa$_2$Cu$_3$O$_x$-based superconducting materials to be joined and, upon cooling, becomes an oxide superconductor of the same type as the REBa$_2$Cu$_3$O$_x$-based superconducting materials to be joined, aligning the materials to be joined so as to have an identical orientation, partially melting the junction and conducting orientation and growth in the junction.

EXAMPLE 1

Figure 5:
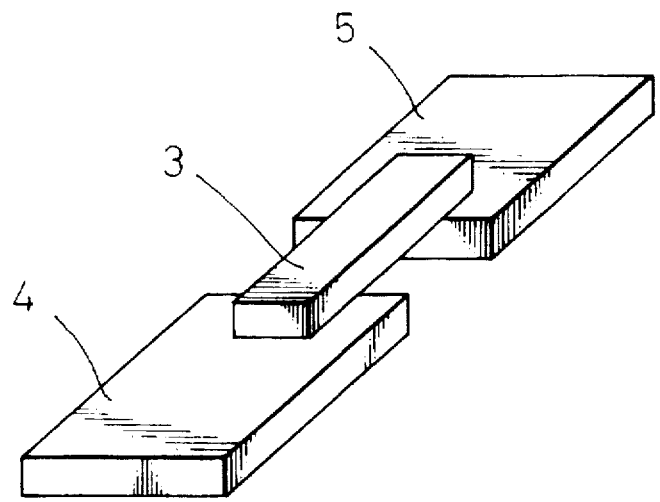
FIG. 5 is a perspective view showing a positional relationship in joining in a working example.

Joining of a YBa$_2$Cu$_3$O$_x$-based material prepared by the melt process was attempted. In this material, although a Y$_2$BaCuO$_5$ phase having an average size of not more than 2 μm was dispersed therein, the matrix comprised an oriented YBa$_2$Cu$_3$O$_x$ superconducting phase free from a large angle grain boundary. Plate samples were taken off from this material and placed as shown in FIG. 5. In the drawing, the YBa$_2$Cu$_3$O$_x$ materials 3 to be joined, indicated by the numerals 4 and 5, had a size of 1×4×10 mm, and the YBa$_2$CU$_3$O$_x$ material for use in joining had a size of 1×2×8 mm. The joining area was 2 mm×2 mm. Regarding crystal orientation, the direction vertical to the joining area was the c-axis, and also in the a-/b-axis, the materials were regulated so as to have an identical orientation. The crystal orientation was judged from cleavage plane, cracks and twin patterns. It is known that the cleavage and the crack occur within the ab plane while a twin boundary occurs in a place which is parallel to the c-axis and has an angle of 45° to the a-/b-axis.

Figure 6:
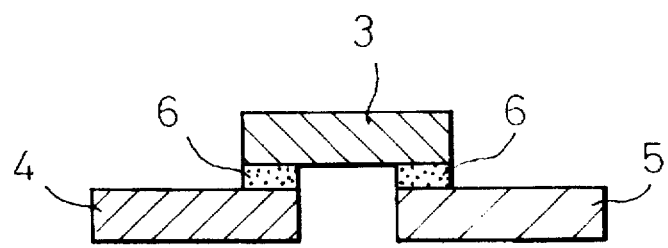
FIG. 6 is a perspective view showing a positional relationship between samples to be joined and a joining solder in a working example.

In these materials, as shown in the cross-sectional view of FIG. 6, the joining interface was covered with a powdery joining solder 6 in a thickness of 0.5 mm. The junction solder was prepared by weighing a Yb$_2$O$_3$ powder, a BaCO$_3$ powder and a CuO powder in an element ratio of Yb to Ba to Cu of 1.2:1.8:2.6, heating the mixture in a platinum crucible at 1450° C. for 5 min, rapidly cooling the heated mixture on a copper hearth and pulverizing the cooled mixture.

Figure 7:
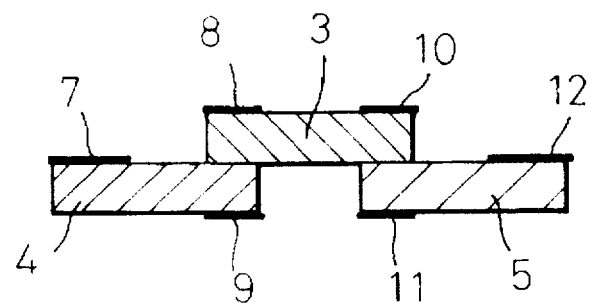
FIG. 7 is a perspective view showing a positional relationship of a silver electrode as a film formed for the measurement of a critical current density in a working example.

The above assembly sample was heated to 985° C. on an aluminum plate over a period of 2 hr, gradually cooled from this temperature to 880° C. at a rate of 1° C./hr and then subjected to furnace cooling to room temperature. In the heat-treated sample, joining was confirmed at the joining interface. Further, a silver film was formed on the sample in its portions 7 to 12 shown in FIG. 7 by using a sputtering device, and the sample was heated in an oxygen gas stream at 600° C., gradually cooled from this temperature to 300° C. at a rate of 10° C./hr and then subjected to furnace cooling to room temperature. In this case, the formation of a silver film was carried out for the purpose of flowing a current to measure the electric resistance, while the heat treatment in oxygen was carried out for the purpose of lowering the contact resistance during the measurement and bringing the sample to a superconductor.

In this sample, a current was flowed across an electrode 7 and an electrode 12, and the voltage was measured across electrodes 8 and 9 and across electrodes 10 and 11. The measurement was carried out at liquid nitrogen temperature. As a result, it was found that no voltage (not more than 0.5 μV) occurred across the electrodes 8 and 9 and across the electrodes 10 and 11 even when a current of 200 A was flowed. Therefore, the joining has a critical current density of not less than 5000 A/cm$^2$ at 77K.

Figure 8:
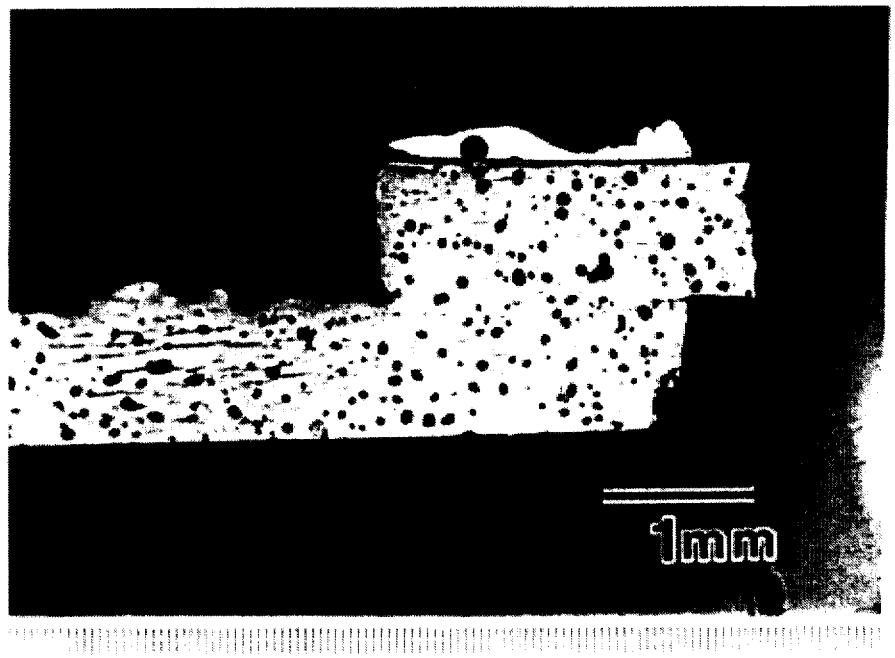
FIG. 8 is an optical microphotograph of a junction.

Further, the cross section of the joining between the electrodes 8 and 9 was observed under a polarizing microscope. As a result, it was found that, as shown in FIG. 8, the joining could be successfully attained to such an extent that the joined portions were indistinguishable. In the polarizing microscope, a grain boundary having a different crystal orientation should be distinguishable as a difference in contrast. In the photograph of FIG. 8, black streaks parallel to the longitudinal direction of the sample and black spots are respectively cracks (occurring parallel to the ab plane) and voids.

Figure 9:
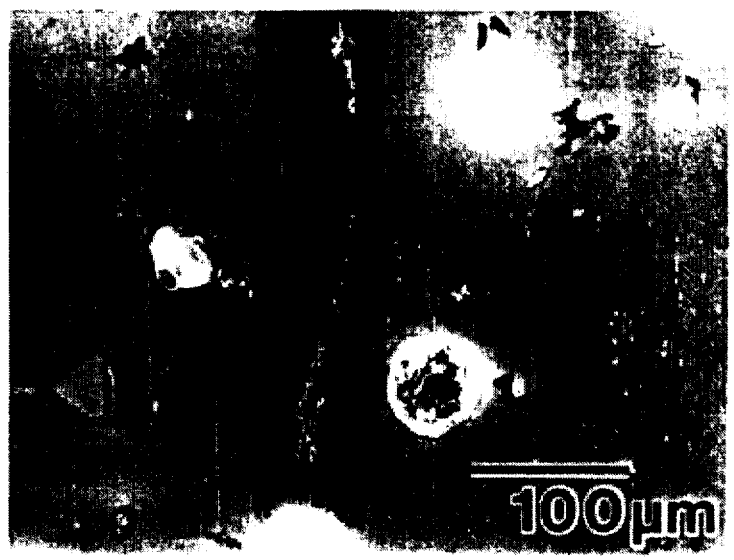
FIG. 9 is an absorption electron image in the vicinity of a joining interface.
Figure 10:
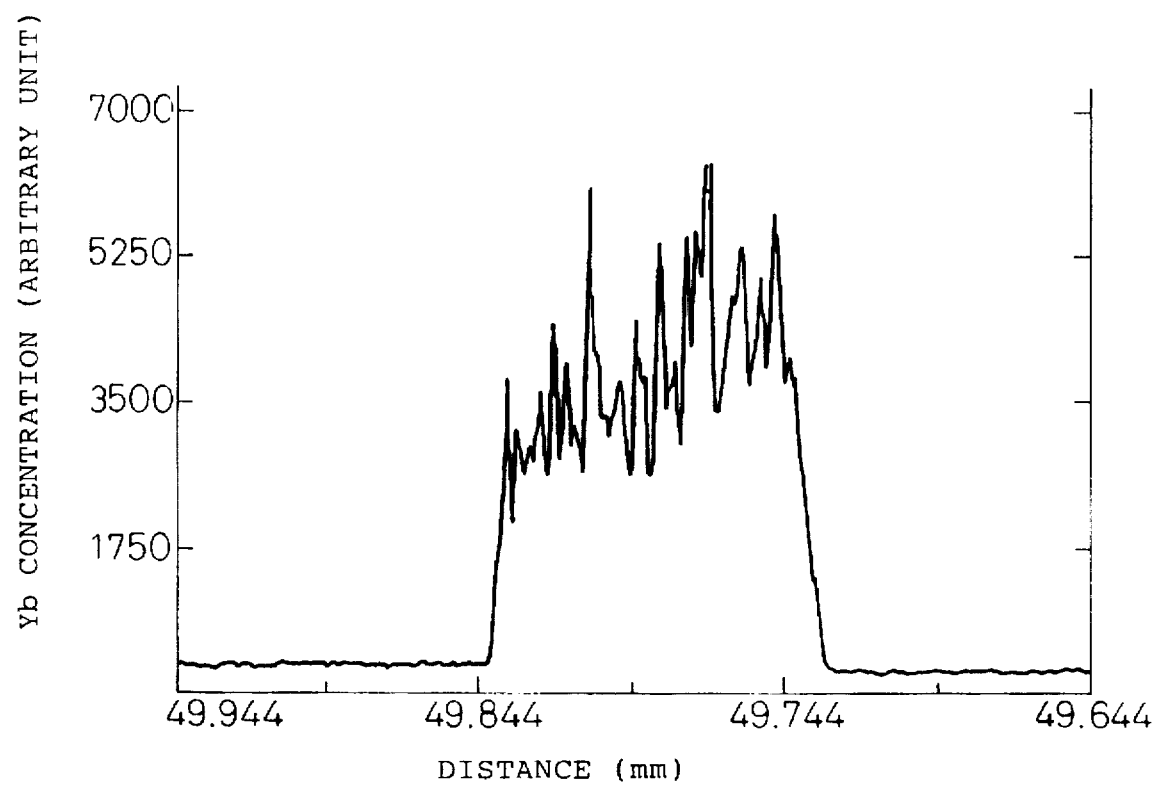
FIG. 10 is a graph showing a concentration distribution of Yb crossing a joining layer as measured by EPMA.

FIG. 9 is an absorption electron image in the vicinity of the joining interface. In the photograph, deep-color portions contain Yb having a large atomic weight and constitute a joining layer. As can be seen from the drawing, an about 100-μm joining layer was formed in the joined product. FIG. 10 shows a Yb distribution taken along a straight line crossing the joining interface at a right angle. Such an analysis by EPMA was carried out for Y, Ba and Cu. As a result, it was found that the joining layer was composed mainly of a YbBa$_2$Cu$_3$O$_x$ phase in which Y was slightly dissolved in a solid solution form. The above results demonstrate that the two $YbBa_2Cu_3O_x$ superconducting phases having an identical orientation was joined with each other through a $YbBa_2Cu_3O_x$ joining phase having the same orientation as the $YbBa_2Cu_3O_x$ superconducting phases.

EXAMPLE 2

Joining of a $SmBa_2Cu_3O_x$-based superconducting material prepared by the melt process was attempted. In this material, although a $Sm_2BaCuO_5$ phase was dispersed therein, the matrix comprised an oriented $SmBa_2Cu_3O_x$ superconducting phase free from a large angle grain boundary. Samples were taken off from this material and placed in the same manner as in Example 1. As shown in the cross-sectional view of FIG. 6, the joining interface of these materials was covered with a powdery joining solder 6 in a thickness of 0.5 mm. The joining solder was prepared by weighing and mixing together a $Y_2O_3$ powder, a $BaO_2$ powder and a CuO powder in an element ratio of Y to Ba to Cu of 1:2:3 and heat-treating the mixture in an oxygen gas stream at 800° C. for 10 hr.

The above assembly sample was heated to 1045° C. on an aluminum plate over a period of 2 hr, gradually cooled from this temperature to 950° C. at a rate of 1° C./hr and then subjected to furnace cooling to room temperature. In the heat-treated sample, it was confirmed that the materials were successfully joined at the joining interface. Thereafter, the formation of a silver film and heat treatment in oxygen were carried out in the same manner as in Example 1. In this sample, a current was flowed across an electrode 7 and an electrode 12, and the voltage was measured across electrodes 8 and 9 and across electrodes 10 and 11. The measurement was carried out at liquid nitrogen temperature. As a result, it was found that no voltage (not more than 0.5 µV) occurred across the electrodes 8 and 9 and across the electrodes 10 and 11 even when a current of 200 A was flowed. Therefore, the junction has a critical current density of not less than 5000 $A/cm^2$ at 77K.

EXAMPLE 3

Joining of a $YBa_2Cu_3O_x$-based superconducting material prepared by the melt process was attempted. In this material, although a $Y_2BaCuO_5$ phase having an average size of not more than 2 µm was homogeneously dispersed therein, the matrix comprised an oriented $YBa_2Cu_3O_x$ superconducting phase free from a large angle grain boundary. Samples were taken off from this material and placed in the same manner as in Example 1. As shown in the cross-sectional view of FIG. 6, the joining interface of these materials was covered with a powdery joining solder 6 in a thickness of 0.5 mm. The joining solder was prepared by weighing a $Yb_2O_3$ powder, a $BaCO_3$ powder and a CuO powder in an element ratio of Yb to Ba to Cu of 1.6:2.3:3.3, heating the mixture in a platinum crucible at 1450° C. for 5 min, rapidly cooling the heated mixture on a copper hearth, pulverizing the cooled mixture and adding 10% by weight of $Ag_2O$ to the powder.

For the above assembly sample, heat treatment and the formation of a silver film were carried out in the same manner as in Example 1. In this sample, a current was flowed across an electrode 7 and an electrode 12, and the voltage was measured across electrodes 8 and 9 and across electrodes 10 and 11. The measurement was carried out at liquid nitrogen temperature. As a result, it was found that no voltage (not more than 0.5 µV) occurred across the electrodes 8 and 9 and across the electrodes 10 and 11 even when a current of 200 A was flowed. Therefore, the junction has a critical current density of not less than 5000 $A/cm^2$ at 77K.

EXAMPLE 4

Figure 11:
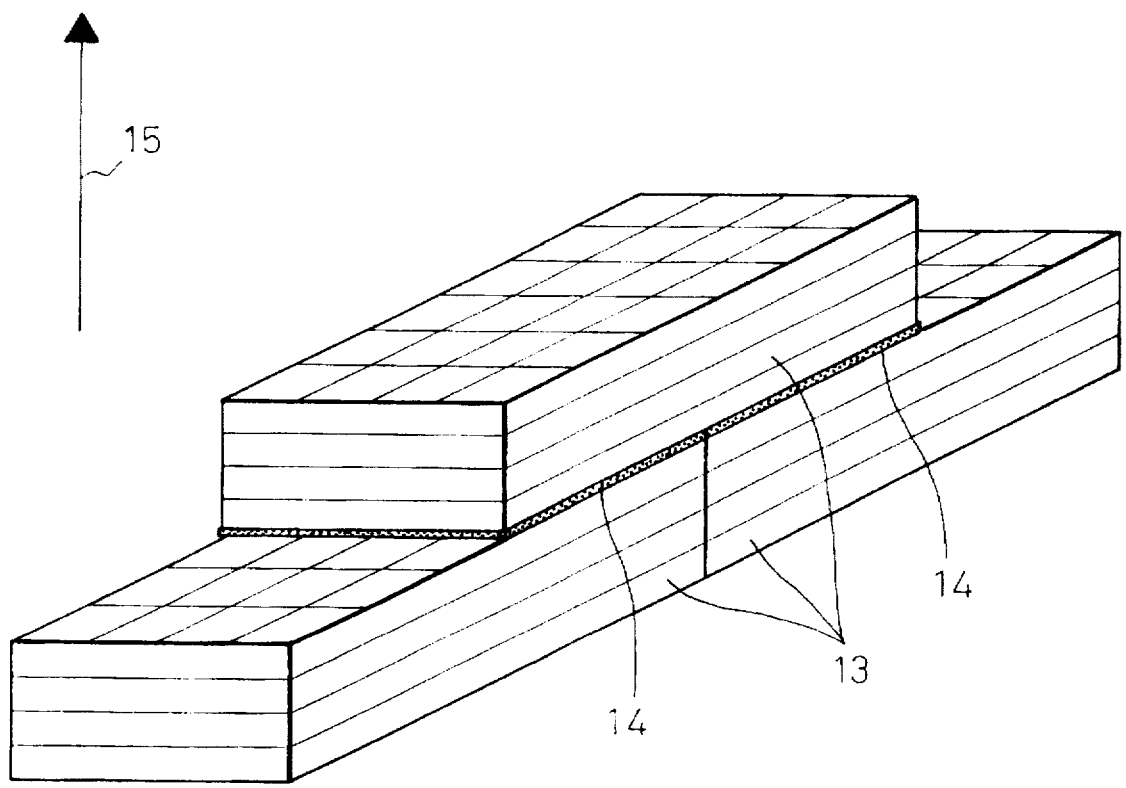
FIG. 11 is a perspective view showing a positional relationship between a sample to be joined and a joining solder in a working example.

Joining of a $YBa_2Cu_3O_x$-based superconducting material prepared by the melt process was carried out, and properties of the junction in a magnetic field were evaluated. In this material, although a $Y_2BaCuO_5$ phase having an average size of not more than 2 µm was dispersed therein, the matrix comprised an oriented $YBa_2Cu_3O_x$ superconducting phase free from a large angle grain boundary. These materials and a joining solder were placed as shown in a perspective view of FIG. 11. The three $YBa_2Cu_3O_x$-based superconducting materials 13 to be joined had a length (in the direction of current flow) of 8 mm, a width of 4 mm and a thickness of 2 mm. The joining solder 14 had a thickness of about 1 mm, and the junction had an area of 4 mm×4 mm. The orientation was regulated in such a manner that the direction of thickness was that of c-axis with the directions of length and width being those of a-/b-axis. In the drawing, an arrow 15 designates the direction of the c-axis, and the lattice pattern represents the a-/b-axis.

The joining solder was prepared by weighing a $Yb_2O_3$ powder, a $BaO_2$ powder and a CuO powder in an element ratio of Yb to Ba to Cu of 1.3:1.7:2.4, further adding 0.5% by weight of metallic platinum, milling them together, calcining the mixture in an oxygen gas stream at 800° C. for 10 hr, pulverizing the calcination product and molding the powder, firing the molded product at 890° C. for 24 hr and taking off the joining solder from the fired product.

The above sample assembly was heated to 975° C. over a period of 4 hour on an aluminum plate while pressing the sample assembly by putting a weight of 150 g on the top of the sample located at the center of the assembly for the purpose of increasing the adhesion of the joining. The assembly was held at that temperature for 4 hr, cooled to 920° C. over a period of one hr, gradually cooled from 920° C. to 840° C. at a rate of 5° C./hr and then subjected to furnace cooling to room temperature. For comparison, an additional sample which had been subjected to furnace cooling from 920° C. to room temperature was prepared. For this comparative sample, the average rate of cooling from 920° C. to 840° C. was about 300° C./hr. The sample which had been gradually cooled at a rate of 5° C./hr was designated as sample A, and the sample which had been cooled at a rate of 300° C./hr was designated as sample B.

Figure 12:
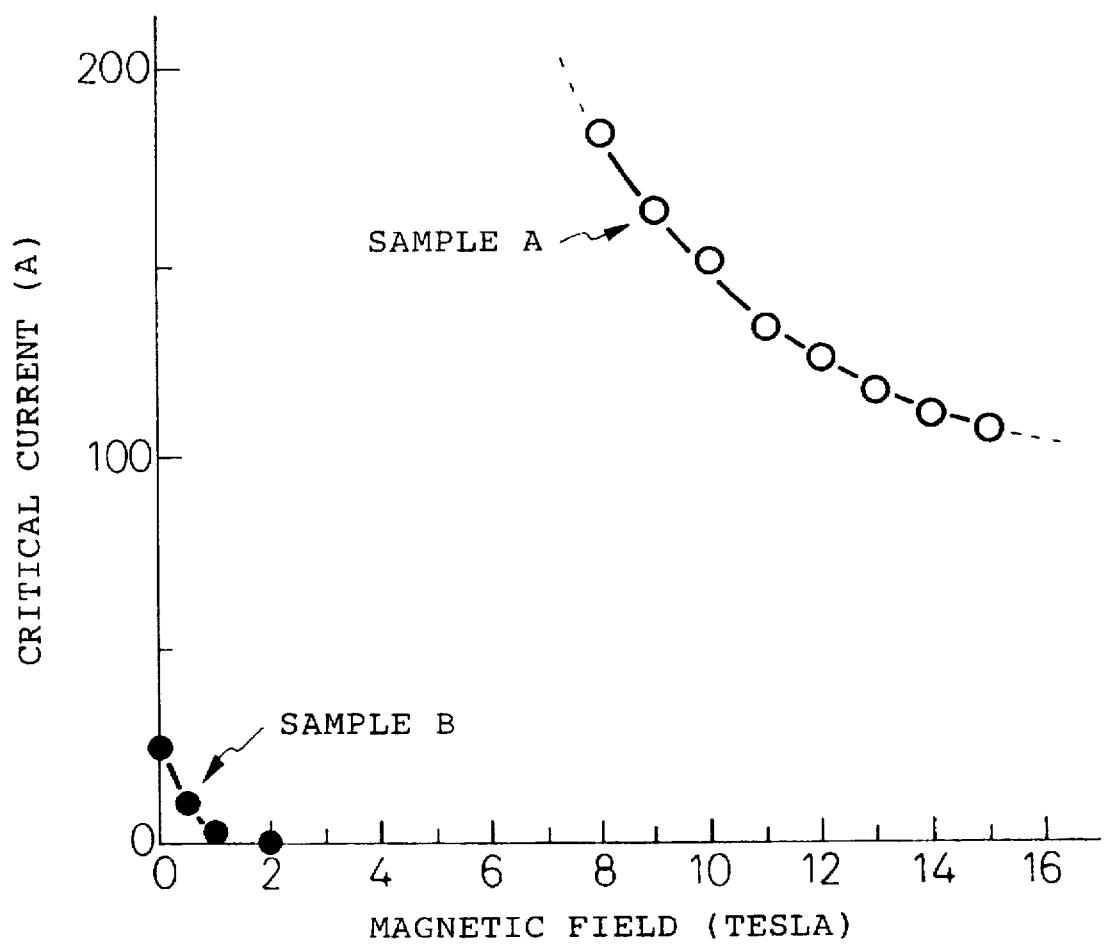
FIG. 12 is a critical current of a junction measured in a magnetic field in a working example.

In both the samples A and B, it was found that the materials could be firmly joined at their joining interface. Further, for these samples, the formation of a silver film and the heat treatment in an oxygen gas stream were carried out in the same manner as in Example 1. The critical current across both ends with a junction sandwiched therebetween was measured in a magnetic field. The magnetic field makes a right angle with the direction of the c-axis. The results are shown in FIG. 12. In the graph, ○ represents data for sample A with ● representing data for sample B.

As shown in the drawing, the critical current of sample B was low and rapidly lowered in a magnetic field, whereas sample A had a critical current of 150 A in a magnetic field of 10 T. The critical current characteristics in a magnetic field of not more than 8 T could not be measured due to the capacity of a sample holder.

Figure 13:
FIGS. 13 and 14 are optical (polarizing) microphotographs of junctions.
Figure 14:

The structure of these samples in their junctions was observed under a polarizing microscope. FIGS. 13 and 14 are photographs of planes perpendicular to joining areas respectively for samples A and B, and in each photograph, a joining layer was present in the vertical direction in the photograph at its center. As is apparent from these photographs, no crystal grain boundary was observed in the junction of sample A, whereas the formation of polycrystals was observed in the joining interface of sample B which had been rapidly cooled. The reason why the critical current density of sample B was low is that polycrystals were formed at the junction and the grain boundary served as a weak bond.

Figure 15:
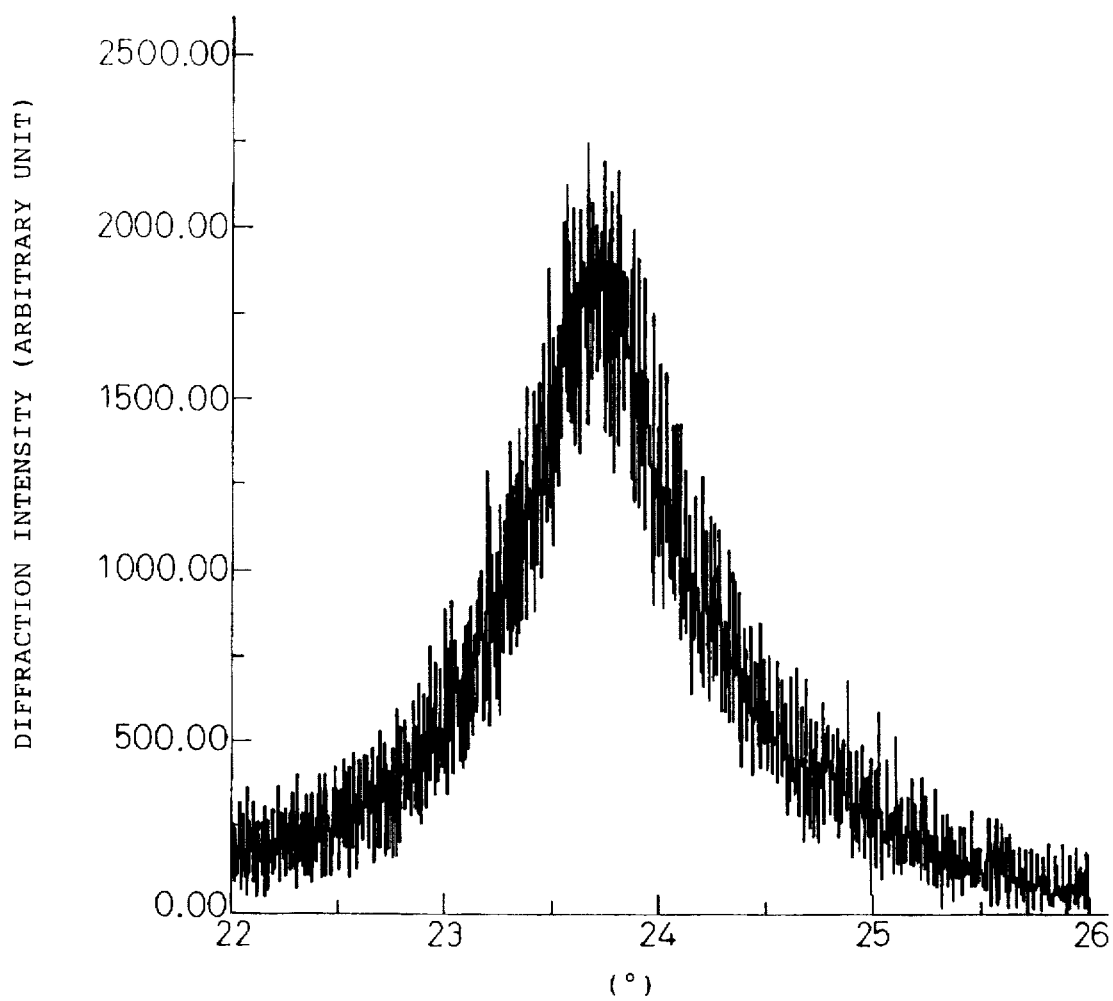
FIG. 15 is a diffraction peak of a joining area from a (006) plane by X-ray diffractometry.

The joining area of sample A was shaved parallel to the ab plane of $YBa_2CU_3O_x$ by mechanical polishing to expose the surface, and the joining area was subjected to ω scanning using a quardriaxial goniometer to obtain an X-ray diffraction peak. The size of X-ray spot was about 4 mm². FIG. 15 is a locking curve from the (006) plane, and it was found that the half-value width of the peak was about 1°. The ω scanning is a technique commonly used for determining the orientation of highly orientated grains, and the locking curve obtained by the ω scanning represents the grain orientaion. In this case, the abscissa represents the breadth of angle at which the c-axis is distributed in the region of 4 mm². In the oriented $REBa_2Cu_3O_x$ bulk material used in the present example, the half-value width is in the range of from 0.50 to 10. Since the half-value width for the joining phase is also about 1°, it was found that the c-axis of $YbBa_2Cu_3O_x$ constituting joining layer is substantially perpendicular to the joining face and the orientation thereof is identical to that of the joined $YBa_2Cu_3O_x$ bulk. Further, the observation of the twin pattern in the joining face under a polarizing microscope revealed that the twin pattern had the same orientation as the $YBa_2Cu_3O_x$ around the twin pattern. Therefore, it was found that also in the a-/b-axis, the joining layer had the same orientation as the $YBa_2Cu_3O_x$ around the joining layer.

EXAMPLE 5

Then, the critical current density of several junctions having a crystal misorientation was determined. The positional relationship between the $YBa_2Cu_3O_x$ sample used and the joining solder was the same as that in Example 4. The sizes of the sample and the joining solder were the same as those in Example 4, except that the thickness of the joining solder was 0.3 mm.

Figure 16:
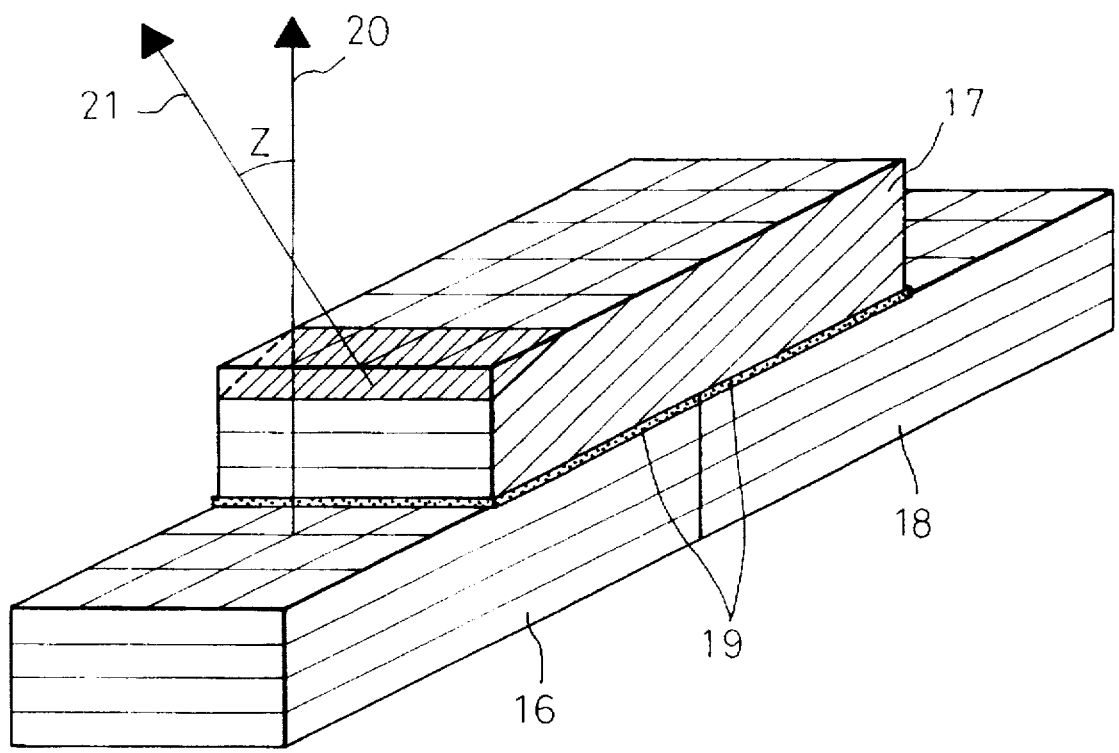
FIGS. 16 and 17 are perspective views showing a positional relationship between samples to be joined and a joining solder in working examples.

At the outset, in order to provide a crystal misorientation in the direction of the c-axis, the $YBa_2Cu_3O_x$ to be joined and disposed at the center of the assembly was placed so that the c-axis was slanted. This material was placed as shown in FIG. 16. In FIG. 16, the crystal orientation of $YBa_2CU_3O_x$ materials 16, 18 is the same as that in Example 4. Specifically, the direction of an arrow 20 is the c-axis, and the direction of the width and length of the sample is the a-/b-axis. The a/b-axis of $YBa_2Cu_3O_x$ material 17 shown in FIG. 16 was regulated so as to conform to those of the samples 16, 18 with respect to the rotation of the c-axis. On the other hand, the c-axis was slanted, and this angle is expressed as z. In FIG. 16, the hatched plane represents a plane parallel to the ab plane of the sample 17, and the c-axis is the direction of an arrow 21. The formation of a silver film was carried out in the same manner as in Example 1, and a current was flowed across the samples 16 and 18 to measure the critical current density of the joining area. The relationship between z and the critical current density at 77K and 5 T is summarized in the following table. The magnetic field was perpendicular to the c-axis.

| z (°) | Critical current density (A/cm²) |
|---|---|
| 0 | Not less than 1250 |
| 10 | 185 |
| 15 | 5 |
| 20 | 2 |
| 30 | 1 |

From this table, it is apparent that the critical current density lowers with an increase in crystal misorientation of the c-axis.

Figure 17:
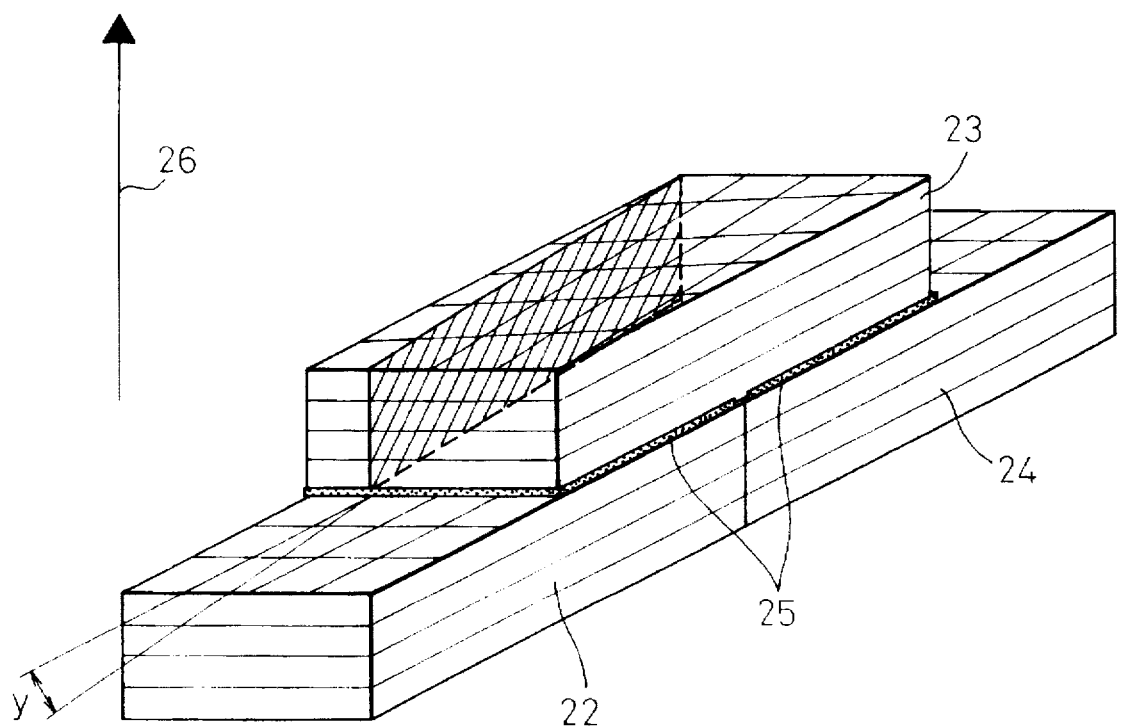

Then, in order to provide a crystal misorientation in the direction of the a-/b-axis, the $YBa_2Cu_3O_x$ to be joined and located at the center of the assembly was placed with it being rotated about the c-axis as shown in FIG. 17. In FIG. 17, the direction of the lattice represents the direction of the a-/b-axis. Further, in FIG. 17, the $YBa_2Cu_3O_x$ samples 22 and 24 had the same crystal orientation as in Example 4, and the direction of an arrow is the c-axis of the three samples. Specifically, the direction of c-axis of the $YBa_2Cu_3O_x$ 23 in FIG. 17 is in agreement with that of the samples 22 and 24. However, the a-/b-axis of the $YBa_2Cu_3O_x$ 23 is different from that of the samples 22 and 24, and the angle which the a-/b-axis of the $YBa_2Cu_3O_x$ 23 makes with that of the samples 22 and 24 is expressed as y. In the drawing, the hatched plane is a plane parallel to a plane surrounded by the c-axis and the a-/b-axis of the sample 23. The assembly was subjected to a treatment for the formation of a silver film in the same manner as in Example 1, and a current was flowed across the samples 22 and 24 to measure the critical current density of the junction area. The relationship between y and the critical current density at 77K and 5 T is summarized in the following table. The magnetic field was perpendicular to the c-axis.

| y (°) | Critical current density (A/cm²) |
|---|---|
| 0 | Not less than 1250 |
| 10 | 85 |
| 15 | 6 |
| 20 | 3 |
| 45 | 1 |

From this table, it is apparent that the critical current density lowers with an increase in crystal misorientation of the a-/b-axis.

As is apparent from the above experimental results, no high critical current density can be obtained when the difference in crystal axis, i.e., c-axis and a-/b-axis, between the materials to be joined is not less than 15°. Although the necessary critical current density varies depending upon the applications, when the critical current density of the joined product with the crystal misorientation of the axis being not less than 15° is equal to that of polycrystalline materials, so that the features of the present invention is substantially lost.

EXAMPLE 6

Figure 18:
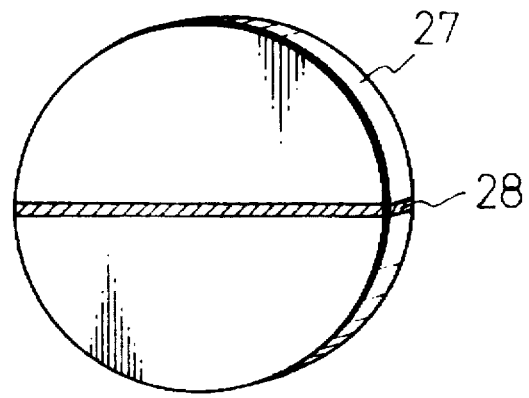
FIG. 18 is a perspective view showing a positional relationship between samples to be joined and a joining solder in a working example.

An experiment on the form of joining shown in FIG. 2 was carried out. In a material to be joined, although a $Y_2BaCuO_5$ phase having an average size of not more than 2 μm was dispersed therein, the matrix comprised an oriented $YBa_2Cu_3O_x$ superconducting phase free from a large angle grain boundary. The materials and a joining solder were placed as shown in FIG. 18. The two $YBa_2Cu_3O_x$-based superconducting materials 27 to be joined were provided by cutting disks having a diameter of 30 mm and a thickness of 7 mm from the center portion of disks. Regarding the crystal orientation of the samples, the direction of the thickness of the disk was the c-axis. The joining solder 28 comprised the same material as that described in Example 4 and placed to have a size of 31×7.5×0.5 mm. The resultant assembly was placed within a furnace so that the joining plane was horizontal. Then, it was subjected to heat treatment for joining while applying a load of 400 g from the top of the assembly in the same manner as in Example 4, except that the rate of gradual cooling from 920° C. to 840° C. was 2° C./hr. Further, for comparison in the same manner as in Example 4, a sample which had been cooled from 920° C. to 840° C. at a rate of 300° C./hr was also prepared. The sample which had been cooled at a rate of 2° C./hr was designated as sample C, and the sample which had been cooled at a rate of 300° C./hr as sample D.

In the two samples 27 which had been heat-treated as described above, strong joining was observed at the joining interface 31. The two samples, however, were different from each other in texture at the joining area. Specifically, no grain boundary was observed in the joining interface of sample C, whereas the joining interface of sample D was in a polycrystalline form.

Then, these two samples were subjected to an oxygen enrichment treatment at 450° C. for 100 hr in an oxygen gas stream and cooled in a magnetic field. Then, the trapped magnetic flux density was measured. At the outset, a magnetic field of 1.3 T was applied in the direction of thickness of the disk at room temperature, and the superconductor was cooled with liquid nitrogen with the magnetic field being held to remove the magnetic field. The two superconductors were in a magnetized state. A Hall probe 30 was adhered to the surface of the disk 27 at its positions shown in FIGS. 19 and 20, and the magnetic flux density in a direction perpendicular to the surface of the sample was measured.

Figure 19:
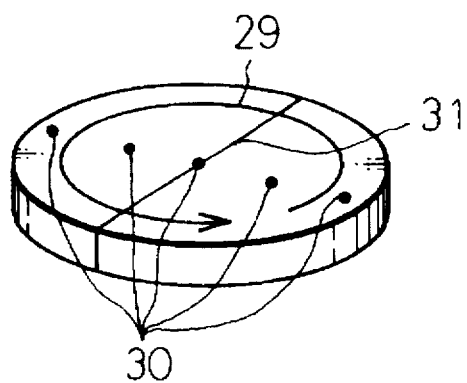
FIG. 19 is a perspective view showing the position of a Hall probe of a sample (sample C), which has been gradually cooled at a rate of 2° C./hr, and a current flow after cooling in a magnetic field.
Figure 20:
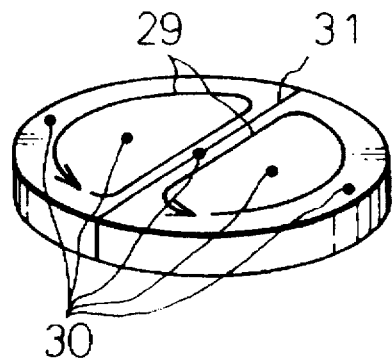
FIG. 20 is a perspective view showing the position of a Hall probe of a sample (sample D), which has been cooled at a rate of 300° C./hr, and a current flow after cooling in a magnetic field.
Figure 21:
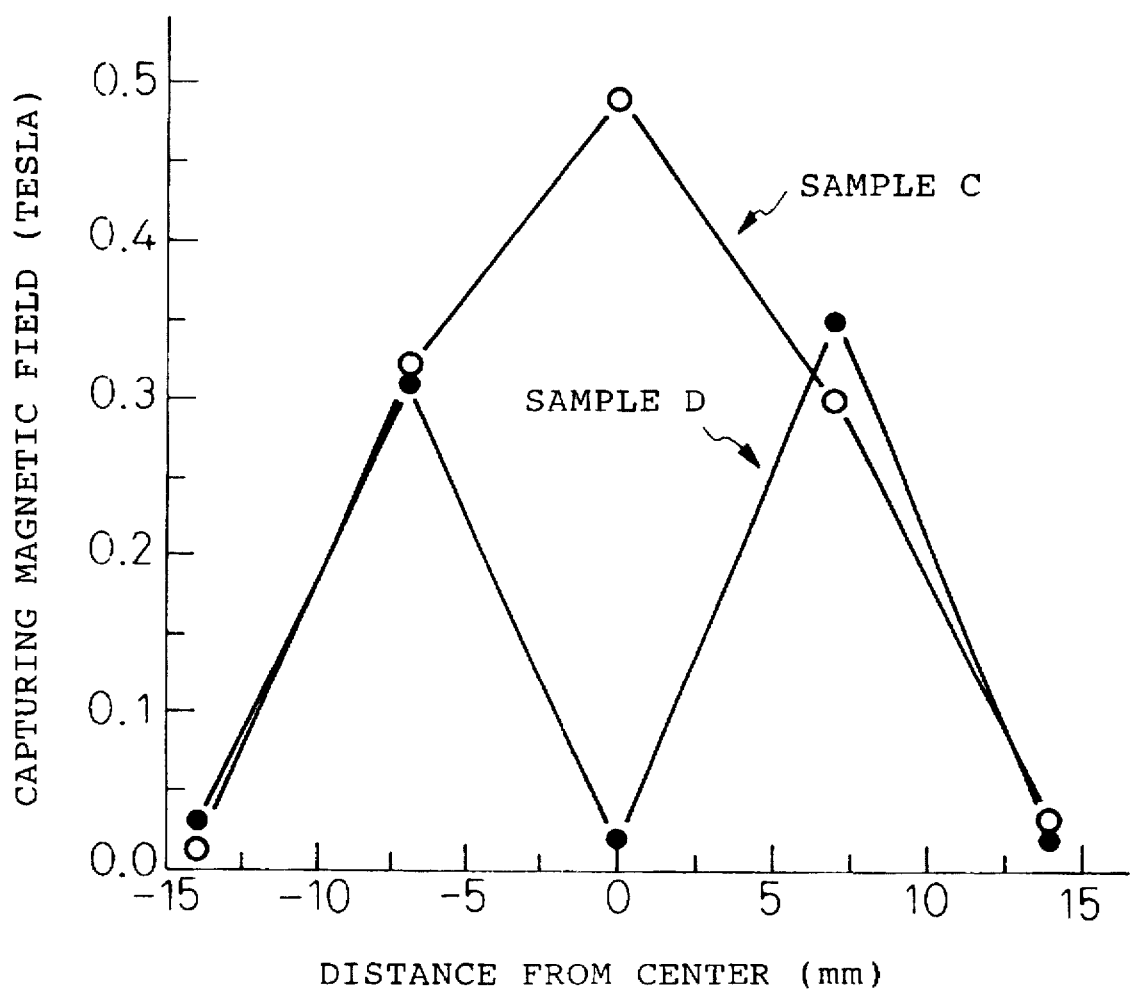
FIG. 21 is a graph showing the trapped magnetic flux density distribution measured after cooling in a magnetic field in a working example.

The results are shown in FIG. 21. In the graph, ○ represents data for sample C, while ● represents data for sample D. The magnetic flux density distribution for sample C was in a large angular form. On the other hand, in sample C which had been cooled at a high rate and has a polycrystalline joining interface, the magnetic flux density was 0 in the joining interface. This suggests that as shown in FIG. 19, in the inside of sample C, a large superconducting permanent current 29 flows around/circulate through the whole sample across the joining area, whereas in sample D having a polycrystalline joining interface 31, since a large superconducting current cannot be flowed across the junction, the superconducting current 29 is detoured as shown in FIG. 20. The superconducting permanent current flowing across the junction of sample C estimated from the magnetic flux density distribution was about 8000 A/cm².

Further, the experimental results suggest that when sample C is cooled in a non-magnetic field, shielding up to about 0.5 T is possible at the center of sample C.

EXAMPLE 7

An experiment on joining as shown in FIG. 3 was carried out. A material to be joined comprised an oriented $(Y_{0.9}Gd_{0.1})Ba_2Cu_3O_x$ superconductor free from a large angle grain boundary prepared by the melt process. This material and a joining solder were placed as shown in FIG. 3. The two $(Y_{0.9}Gd_{0.1})Ba_2Cu_3O_x$ superconducting materials to be joined had a length (direction of current flow) of 8 mm, a width of 2 mm and a thickness (vertical direction in FIG. 1) of 2 mm, and the joining plane had an area of 2 mm×2 mm. Regarding the orientation, the direction of the thickness was the c-axis. The joining solder had a length of 6 mm, a width of 2 mm and a thickness of 2 mm and was prepared using the same raw material and heat treatment method as in Example 4, except that the element ratio of Yb to Ba to Cu was 1.2:1.8:2.6.

The assembly comprising the samples thus disposed were heated to 995° C. over a period of 4 hr on an aluminum plate, held at that temperature for 4 hr, cooled to 920° C. over a period of 1 hr, gradually cooled from 920° C. to 850° C. at a rate of 1° C./hr and then subjected to furnace cooling to room temperature.

In the heat-treated assembly, joining was successfully attained in the joining interface. The assembly was further subjected to a treatment for the formation of a silver film and heat-treated in oxygen in the same manner as in Example 1, and the critical current across both ends with two junctions being sandwiched therebetween was measured in a magnetic field. As a result, it was found that the critical current density in a magnetic field of 1.6 T was 5000 A/cm².

INDUSTRIAL APPLICABILITY

The joining method according to the present invention is considered useful particularly for the joining of a bulk superconducting material prepared by the melt process such as QMG process. As described above, this material is a monocrystalline (free from a large angle grain boundary) material prepared by taking advantage of crystal growth. In this process, it is difficult to prepare a large material having a size exceeding a certain value, and working and joining which form a grain boundary detrimental to a high critical current density cannot be carried out, which limits the field of applications. On the other hand, the joining prepared according to the method of the present invention free from a brain boundary causative of a lowering in critical current can be widely applied to current leads, magnetic shields in a magnetic field having a medium strength, bulk magnets and superconducting coils, for example, as shown in FIGS. 22 to 25.

Figure 22:
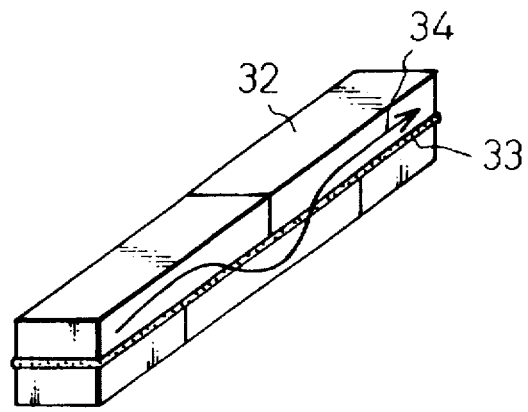
FIG. 22 is a perspective view showing an embodiment wherein a joined product has been used in a current leading conductor.

FIG. 22 shows a current lead formed by successively joining a number of rod-shaped superconductors 32 to one another using a solder 33 to form a long rod. In this current lead, a current flows as indicted by an arrow 34.

Figure 23:
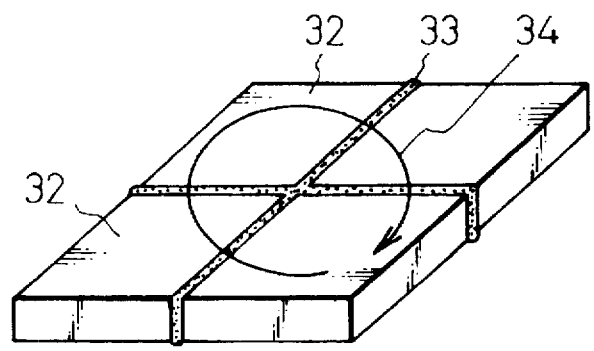
FIGS. 23 and 24 are perspective views showing embodiments wherein joined products have been used respectively in a magnetic shielding material and a bulk magnet.
Figure 24:
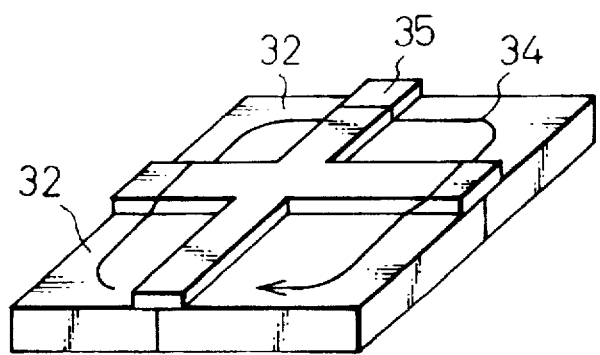

FIGS. 23 and 24 show a magnetic field or a bulk magnet formed by joining a plate superconductor 32 using a solder 33 to form a wider plate. In this case, a current flow as indicated by an arrow 34. In FIG. 23, joining is carried out by forming a solder layer 33 between the plate superconductors 32, and in FIG. 24, the plate superconductors 32 are joined together by using a joining material 35.

Figure 25:
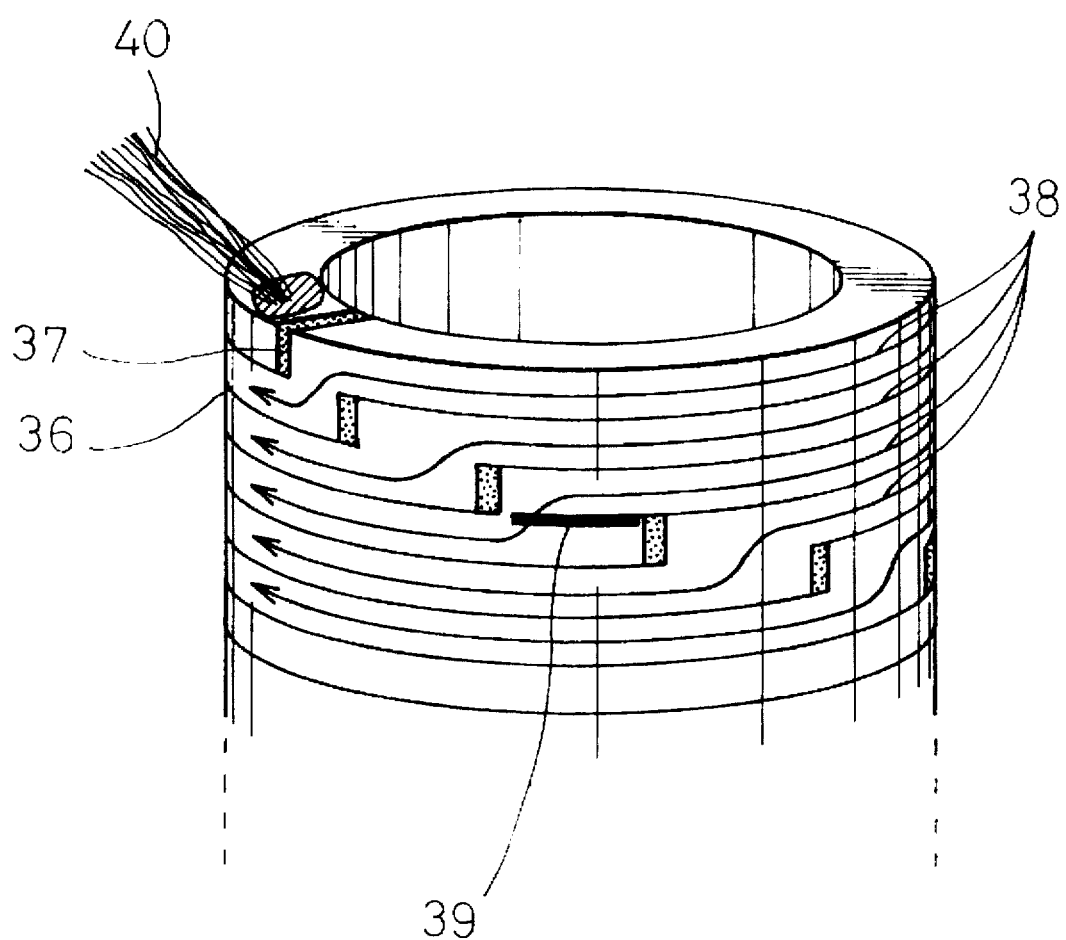
FIG. 25 is a perspective view showing an embodiment wherein a joined product has been used in a superconducting coil.

FIG. 25 shows a superconducting coil. A superconducting coil can be produced by forming a spiral superconducting path 38 using an insulating material 36 and a cut (capable of being filled with an insulating material) 37. Since, however, there is a limitation on the size (coil length), end portions of superconducting paths 38 of superconducting coils are joined together using a solder 39 to successively conduct joining to a desired coil length. Numeral 40 designates an external lead connected to a superconducting coil.

We claim:

1. A joined product comprising a plurality of $RE^1Ba_2Cu_3O_x$-based monocrystalline superconducting material segments, with each segment having a joining area and an identical crystal orientation, said segments joined with each other at said joining areas with an $RE^2Ba_2Cu_3O_x$- based superconducting phase monocrystalline solder formed by a melt process, wherein
- $RE^1$ is at least one element selected from a group consisting of Y, Nd, Sm, Eu, Gd, Dy, Ho, Er, Tm, Yb and Lu,
- $RE^2$ is at least one element selected from a group consisting of Y, Nd, Sm, Eu, Gd, Dy, Ho, Er, Tm, Yb and Lu,
- said $RE^2Ba_2Cu_3O_x$-based superconducting phase monocrystalline solder has a lower peritectic temperature than said $RE^1Ba_2Cu_3O_x$-based monocrystalline superconducting material segments, and
- said $RE^2Ba_2Cu_3O_x$-based superconducting phase monocrystalline solder has the same crystal orientation as said $RE^1Ba_2Cu_3O_x$-based monocrystalline superconducting material segments.

2. A joined product according to claim 1 wherein said $RE^2Ba_2Cu_3O_x$-based superconducting phase monocrystalline solder is sandwiched between said $RE^1Ba_2Cu_3O_x$-based monocrystalline superconducting material segments.

3. A joined product comprising a plurality of $RE^1Ba_2Cu_3O_x$-based monocrystalline superconducting material segments, with each segment having a joining area and an identical crystal orientation, said segments joined with each other at said joining areas with an $RE^2Ba_2Cu_3O_x$-based superconducting phase monocrystalline solder formed by a melt process, wherein
- $RE^1$ is at least one element selected from a group consisting of Y, Nd, Sm, Eu, Gd, Dy, Ho, Er, Tm, Yb and Lu,
- $RE^2$ is identical to $RE^1$,
- said $RE^2Ba_2Cu_3O_x$-based superconducting phase monocrystalline solder has added thereto at least one element selected from a group consisting of Ag and Au whereby said $RE^2Ba_2Cu_3O_x$-based superconducting phase monocrystalline solder has a lower peritectic temperature than said $RE^1Ba_2Cu_3O_x$-based monocrystalline superconducting material segments, and
- said $RE^2Ba_2Cu_3O_x$-based superconducting phase monocrystalline solder has the same crystal orientation as said $RE^1Ba_2Cu_3O_x$-based monocrystalline superconducting material segments.

4. A joining method for monocrystalline superconducting material segments comprising:
- providing at least two $RE^1Ba_2Cu_3O_x$-based monocrystalline superconducting material segments, wherein $RE^1$ is at least one element selected from a group consisting of Y, Nd, Sm, Eu, Gd, Dy, Ho, Er, Tm, Yb and Lu,
- aligning at least two of said $RE^1Ba_2Cu_3O_x$-based monocrystalline superconducting material segments to be joined so that they have an identical crystal orientation,
- inserting a solder between faces of said oriented monocrystalline $RE^1Ba_2Cu_3O_x$-based superconducting material segments to be joined to form an assembly, wherein said solder is at least one member selected from a group consisting of an $RE^2Ba_2Cu_3O_x$-based superconducting material and a raw material for an $RE^2Ba_2Cu_3O_x$-based superconducting material, wherein $RE^2$ is at least one element selected from a group consisting of Y, Nd, Sm, Eu, Gd, Dy, Ho, Er, Tm, Yb and Lu, wherein said $RE^2Ba_2Cu_3O_x$-based superconducting material has a lower peritectic temperature than said monocrystalline $RE^1Ba_2Cu_3O_x$-based superconducting material segments to be joined,
- heating said assembly to a temperature above the peritectic temperature of said solder and below the peritectic temperature of said monocrystalline $RE^1Ba_2Cu_3O_x$-based superconducting material segments to be joined,
- said temperature of heating said assembly decomposing said member selected from a group consisting of said $RE^2Ba_2Cu_3O_3$-based superconducting material and said raw material for said $RE^2Ba_2Cu_3O_x$-based superconducting material into a Ba, Cu, and O liquid phase and an $RE_2{}^2BaCuO_5$ solid phase,
- gradually cooling said heated assembly,
- said gradual cooling of said heated assembly providing an $RE^2Ba_2Cu_3O_x$-based superconducting phase monocrystalline solder joining said $RE^1Ba_2Cu_3O_x$-based monocrystalline superconducting material segments, with said $RE^2Ba_2Cu_3O_x$-based superconducting phase monocrystalline solder having the same crystalline orientation as said $RE^1Ba_2Cu_3O_x$-based monocrystalline superconducting material segments joined by said solder.

5. A joining method for monocrystalline superconducting material segments comprising:
- providing at least two $RE^1Ba_2Cu_3O_x$-based monocrystalline superconducting material segments, wherein $RE^1$ is at least one element selected from a group consisting of Y, Nd, Sm, Eu, Gd, Dy, Ho, Er, Tm, Yb and Lu,
- aligning at least two of said $RE^1Ba_2Cu_3O_x$-based monocrystalline superconducting material segments to be joined so that they have an identical crystal orientation,
- placing a solder on said monocrystalline $RE^1Ba_2Cu_3O_x$-based superconducting material segments to be joined to form an assembly, wherein said solder is at least one member selected from a group consisting of an $RE^2Ba_2Cu_3O_x$-based superconducting material and a raw material for an $RE^2Ba_2Cu_3O_x$-based superconducting material, wherein $RE^2$ is at least one element selected from a group consisting of Y, Nd, Sm, Eu, Gd, Dy, Ho, Er, Tm, Yb and Lu, wherein said $RE^2Ba_2Cu_3O_x$-based superconducting material has a lower peritectic temperature than said monocrystalline $RE^1Ba_2Cu_3O_x$-based superconducting material segments to be joined,
- heating said assembly to a temperature above the peritectic temperature of said solder and below the peritectic temperature of said monocrystalline $RE^1Ba_2Cu_3O_x$-based superconducting material segments to be joined,
- said temperature of heating said assembly decomposing said member selected from a group consisting of said $RE^2Ba_2Cu_3O_x$-based superconducting material and said raw material for said $RE^2Ba_2Cu_3O_x$-based superconducting material into a Ba, Cu, and O liquid phase and an $RE^2{}_2BaCuO_5$ solid phase,
- gradually cooling said heated assembly,
- said gradual cooling of said heated assembly providing an $RE_2Ba_2Cu_3O_x$-based superconducting phase monocrystalline solder joining said $RE^1Ba_2Cu_3O_x$-based monocrystalline superconducting material segments, with said $RE^2Ba_2Cu_3O_x$-based superconducting phase monocrystalline solder having the same crystalline orientation as said $RE^1Ba_2Cu_3O_x$-based monocrystalline superconducting material segments joined by said solder.

* * * * *

UNITED STATES PATENT AND TRADEMARK OFFICE
CERTIFICATE OF CORRECTION

PATENT NO. : 5,786,304
DATED : July 28, 1998
INVENTOR(S) : Keiichi KIMURA, et al.

It is certified that error appears in the above-identified patent and that said Letters Patent is hereby corrected as shown below:

Column 6, line 22, change "150." to --$15°$.--

Column 6, line 33, change "900" to --$90°$--.

Column 6, line 35, change "900" to --$90°$--.

Column 11, line 22, change "0.50" to --$0.5°$--.

Column 11, line 23, change "10" to --$1°$--.

Column 13, line 62, change "($Y_{0.0}$.." to --($Y_{0.9}$..--.

Column 16, line 6, change "..$O_3$-based" to --..$O_x$-based--.

Signed and Sealed this

Twenty-seventh Day of February, 2001

Attest:

NICHOLAS P. GODICI

Attesting Officer   Acting Director of the United States Patent and Trademark Office